(12) United States Patent
Rhodes

(10) Patent No.: US 7,211,848 B2
(45) Date of Patent: May 1, 2007

(54) MASKED SPACER ETCHING FOR IMAGERS

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/921,274

(22) Filed: Aug. 19, 2004

(65) Prior Publication Data

US 2005/0059180 A1    Mar. 17, 2005

Related U.S. Application Data

(62) Division of application No. 10/663,694, filed on Sep. 17, 2003, now Pat. No. 6,908,839.

(51) Int. Cl.
*H01L 21/8238* (2006.01)
(52) U.S. Cl. .................. 257/292; 257/72; 257/291; 257/431
(58) Field of Classification Search .............. 257/72, 257/222, 225, 233, 291, 292, E27.132, E27.133, 257/E27.141, E25.032, 431
See application file for complete search history.

(56) References Cited

U.S. PATENT DOCUMENTS

| | | | |
|---|---|---|---|
| 6,194,258 B1 * | 2/2001 | Wuu | 438/200 |
| 6,207,565 B1 | 3/2001 | Yeh et al. | |
| 6,306,678 B1 * | 10/2001 | Chiang et al. | 438/60 |
| 6,329,233 B1 * | 12/2001 | Pan et al. | 438/199 |
| 6,541,329 B1 * | 4/2003 | Chen et al. | 438/237 |
| 6,607,951 B2 * | 8/2003 | Chen et al. | 438/199 |
| 6,720,595 B2 * | 4/2004 | Clevenger et al. | 257/292 |
| 2005/0056544 A1 * | 3/2005 | Liu et al. | 205/223 |

\* cited by examiner

*Primary Examiner*—George Fourson
*Assistant Examiner*—Joannie Adelle Garcia
(74) *Attorney, Agent, or Firm*—Dickstein Shapiro LLP

(57) ABSTRACT

The invention relates to a dual masked spacer etch for improved dark current performance in imagers. After deposition of spacer material such as oxide, N-channel regions are first opened for N⁺ source/drain implant and P-channel regions are then opened for P⁺ source/drain implant. Prior to the N⁺ source/drain implant, the wafer receives a patterned first spacer etch. During this first spacer etch, the photosensor region is covered with resist. Prior to the P⁺ source/drain implant, a masked second spacer etch is performed. Again the photosensor region is protected with photoresist. In such a manner, spacers are formed on the gates of both the N-channel and P-channel transistors but in the photodiode region the spacer insulator remains.

19 Claims, 9 Drawing Sheets

MASKED SPACER ETCHING FOR IMAGERS

CROSS REFERENCE TO RELATED APPLICATION

The present application is a divisional of U.S. application Ser. No. 10/663,694 filed on Sep. 17, 2003, the disclosure of which is herewith incorporated by reference in its entirety now U.S. Pat. No. 6,908,839.

FIELD OF THE INVENTION

The present invention relates to production of spacers next to gates in semiconductor devices. For example, a CMOS imager may have spacers next to gates of N-channel devices within an array and also next to gates of P-channel devices at the array's periphery.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition for small size imaging applications. CCDs are also capable of large formats with small pixel size and they employ low noise charge domain processing techniques. However, CCD imagers have a number of disadvantages. For example, they are susceptible to radiation damage, they exhibit destructive read out over time, they require good light shielding to avoid image smear and they have a high power dissipation for large arrays.

Because of the inherent limitations in CCD technology, there is an interest in complementary metal oxide semiconductor (CMOS) imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

A CMOS imager circuit includes a focal plane array of pixel cells, each one of the cells including either a photodiode, a photogate or a photoconductor overlying a doped region of a substrate for accumulating photo-generated charge in the underlying portion of the substrate.

In a conventional CMOS imager, the active elements of a pixel cell perform the necessary functions of: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS image sensors of the type discussed above are generally known as discussed, for example, in Nixon et al., "256.times.256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524 which describe operation of conventional CMOS imagers, the contents of which are incorporated herein by reference.

CMOS imagers have a number of advantages, including for example low voltage operation and low power consumption. CMOS imagers are also compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

Many conventional imagers have a photosensitive element formed just below a semiconductor substrate's surface at which circuitry is also formed. In a CMOS imager, for example, each pixel's photosensitive element typically includes a suitably doped region of semiconductor substrate, while the pixel's circuitry includes N-channel devices with gates on the substrate surface. At the periphery of the pixel array, circuitry for image readout and processing typically includes N-channel and P-channel devices with gates also on the substrate's surface.

Both the N-channel and the P-channel gates typically have insulating spacers at their sides, and the spacers act as masks for subsequent operations such as doping. The insulating spacers can be oxide, nitride, or an oxide/nitride sandwich structure. Conventionally, a single blanket spacer etch concurrently forms the spacers for the N-channel and P-channel devices by patterning an oxide layer. This etch removes the insulating layer from the photosensitive element and leaves the photosensitive element exposed to subsequent processes.

Photosensitive elements of CMOS imagers and other imagers are susceptible to various known defects, such as excessive dark current or other leakage and parasitic effects, crosstalk between pixels, and others. It would be advantageous to have improved methods for fabricating imaging devices, to reduce the risk of damage or defects in imager photosensitive elements. It would also be advantageous to have imagers that avoid such risks of damage or defects.

SUMMARY OF THE INVENTION

The invention provides techniques for performing masked spacer etches on imagers. The techniques allow protection of photosensitive elements. An exemplary embodiment of the invention provides an imager produced by a dual masked spacer etch after an insulating layer is deposited over photosensitive elements, gates of N-channel devices, and gates of P-channel devices. The imager includes N-channel regions with N$^+$ source/drain implant and P-channel regions with P$^+$ source/drain implant. Prior to N$^+$ source/drain implant, a first masked spacer etch exposes regions for doping. During this first masked spacer etch, the photosensor region is covered with resist. Prior to the P$^+$ source/drain implant, a second masked spacer etch exposes regions for doping. Again the photosensor region is protected with photoresist. In such a manner, spacers are formed on gates of both the N-channel and P-channel devices, but in photosensor regions, the spacer insulator remains.

The techniques can protect photosensitive elements, and therefore reduce dark current and other defects that could occur if the photosensitive elements were unprotected.

These and other features and advantages of the invention will be more apparent from the following detailed description that is provided in connection with the accompanying drawings illustrating exemplary embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

As used herein in the description of the invention, the N and P designations are used in the common manner to designate donor and acceptor type impurities which promote electron and hole type carriers respectively as the majority carriers. The "+" symbol, when used as a suffix with an impurity type should be interpreted to mean that the doping concentration of that impurity is heavier than the doping associated with just the letter identifying the impurity type without the "+" suffix.

The terms "substrate" and "wafer" can be used interchangeably in the following description and may include any semiconductor-based structure. The structure should be understood to include any of silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but can include metal with other trace metals or in alloyed combinations with other metals as known in the semiconductor art, as long as such alloy retains the physical and chemical properties of a metal. The term "metal" also includes conductive oxides of such metals.

Figure 1:
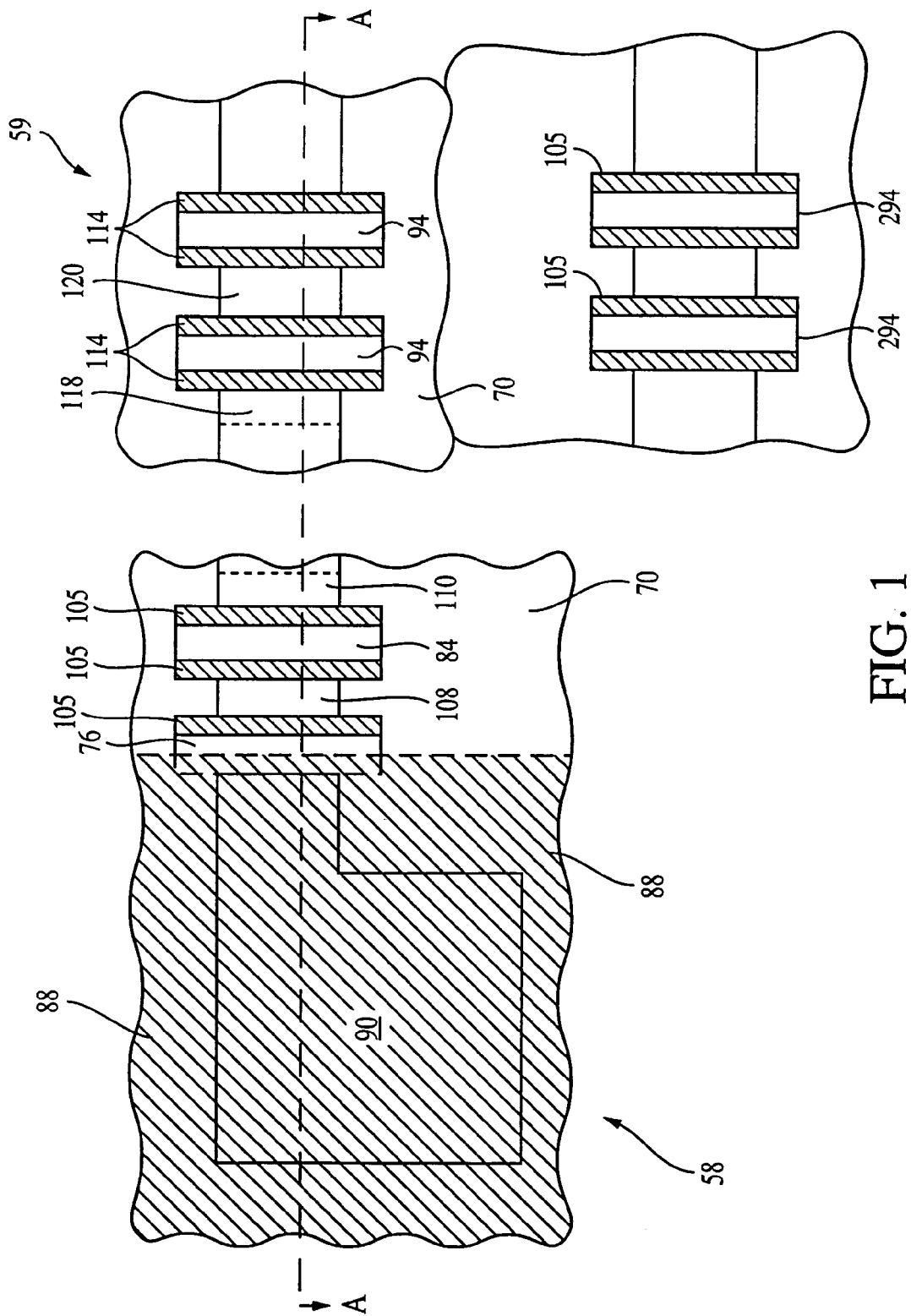
FIG. 1 is a plan view of portions of a CMOS imager integrated circuit (IC) according to an exemplary embodiment of the invention.

In FIGS. 1–9, like reference numbers designate like elements. FIG. 1 illustrates features of an imager integrated circuit ("IC") in which the same material is in spacers along gates of N-channel and P-channel devices and also covers a photosensitive region. FIGS. 2–8 illustrate an exemplary embodiment of the invention using a dual masked spacer etch to produce an IC as in FIG. 1. N-channel regions of the imager device are first patterned for $N^+$ source/drain implant, followed by patterning of P-channel regions and opening for $P^+$ source/drain implant. The order of masked spacer etch including source/drain implant is not critical to this invention. While $N^+$ source/drain regions may be formed prior to $P^+$ source/drain regions, this order can be reversed.

In FIG. 1, portions of 58 and 59 of semiconductor substrate 70 are illustrated at a surface of which a CMOS imager integrated circuit (IC) may be fabricated. The CMOS fabrication process may begin with a lightly-doped P-type or N-type silicon substrate, for example, or lightly-doped epitaxial silicon on a heavily doped substrate. Portion 58 of substrate 70 includes components of a pixel cell's circuitry within an array of pixels, while portion 59 includes representative components formed at the periphery of the array, such as for timing and control or readout of signals from pixel cells.

FIG. 1 shows that spacer material 88 is present in spacers 105 for N-channel devices in portions 58 and 59, in spacers 114 for P-channel devices in portion 59, and also photodiode 90. Spacer material 88 covers photodiode 90 because spacers 105 and 114 are formed by masked spacer etching rather than by a blanket spacer etch.

In CMOS imager applications, procedures that involve a blanket spacer etch often give rise to problems during processing. As a result of a blanket spacer etch, for example, the photodiode region is often subject to damage. A blanket spacer etch can cause spacer over-etch damage to the photodiode, and bare silicon exposed in the photodiode region can be exposed to heavy metal impurities during resist strip, ion implantation, or subsequent cleaning steps. Such problems can often result in an increase in photodiode dark current. Spacer material 88 over photodiode 90 can therefore alleviate photodiode dark current.

One form of dark current is generation current at a photodiode node, which can modify pixel stored charge in a random manner and reduce imaging quality. Dark current in a CMOS imager depends on the device geometry and shape, i.e., corners within the photodiode, their angle and number. As such, the dimensions, i.e. geometry and shape, and numbers of photodiodes and transistor devices described in relation to FIG. 1 and other exemplary embodiments of the invention are only illustrative and may be independently increased or decreased to further improve dark current.

CMOS dark current magnitude is also affected by the photodiode area junction (current depending on doping concentrations, bandgap and temperature of a reversed biased diode), and leakage current due to the active area shape. Dark current can also arise in the electrical connection region along the sidewalls of trench isolation regions. Various measures can be taken to alleviate these sources.

The technique of FIG. 1 has proven particularly effective in reducing dark current in a CMOS imager, and is beneficial because it reduces photosensor dark current during image acquisition, while maintaining the image processing and imaging capabilities of CMOS chip devices.

FIGS. 2–8 show cross-sections during production of circuitry at the surface of substrate 70 to obtain the components shown in FIG. 1. The break symbol (\\) in FIGS. 2 through 7 represents a spatial separation between the array with N-channel transistors and the periphery with N-channel transistors and P-channel transistors.

Figure 2:
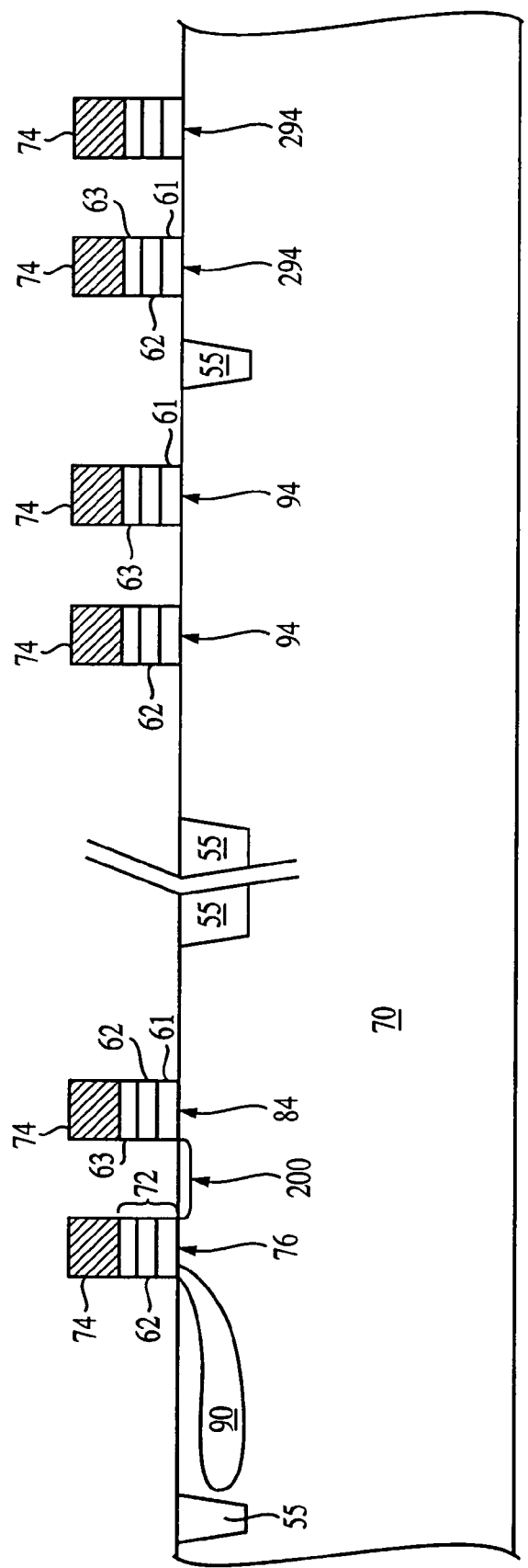
FIGS. 2–7 are a series of schematic cross-sectional views along line A—A in FIG. 1 showing stages in production of an IC with a dual masked spacer etch.

FIG. 2 depicts the FIG. 1 device after gate stack patterning, but prior to a dual masked spacer etch. For exemplary purposes, the substrate 70 may be a silicon substrate. However, as noted above, the invention has equal application to other semiconductor substrates.

As shown in FIGS. 1 and 2, portion 58 includes photodiode 90 formed within the substrate 70. Photodiode 90 functions as a photosensor. Photodiode 90 may, for example, include a photosensitive p-n-p junction region formed at or beneath the upper surface of substrate 70 by conventional techniques.

Portion 58 also includes N-channel transistors controlled by transfer gate 76 and reset gate 84, each formed by first depositing and then patterning a gate stack 72. Gate stack 72 can be formed, for example, by first depositing and then patterning a layer of gate oxide 61, for example a grown or deposited silicon dioxide or a high K insulator, a conductive layer 62 for example doped polysilicon, or a metal, a silicide or a combination of these, and an insulating layer 63 for example oxide or nitride or a combination of these.

Transfer gate 76 transfers photoelectric charges generated in photodiode 90 to a floating diffusion region 200 acting as a sensing node. Reset gate 84 resets the floating diffusion sensing node. The gates may be formed as stacked gates that include an insulating layer 63 over an electrode layer 62 formed over a gate oxide layer 61.

In one embodiment, a layer of gate oxide 61 is formed over the surface of substrate 70. A layer of doped polysilicon 62 is then formed over gate oxide layer 61. An insulating layer 63 is then deposited over the layer of doped polysilicon 62. Layers 61, 62 and 63 may be deposited by any suitable technique, including chemical vapor deposition (CVD) techniques such as low pressure chemical vapor deposition (LPCVD) or high density plasma (HDP) deposition. Gate oxide layer 61 is typically a grown oxide. Photoresist layer 74 is then deposited and patterned. Gates 76 and 84 are then formed by etching exposed portions of layers 61, 62 and 63. P-channel gates 94 and N-channel gates 294 are formed in the periphery in a similar manner. The order of the process steps for gate formation may be varied as is required or convenient for a particular process flow. For example, the gate stacks may be formed before, or after, or between steps that form a photogate sensor.

Figure 3:
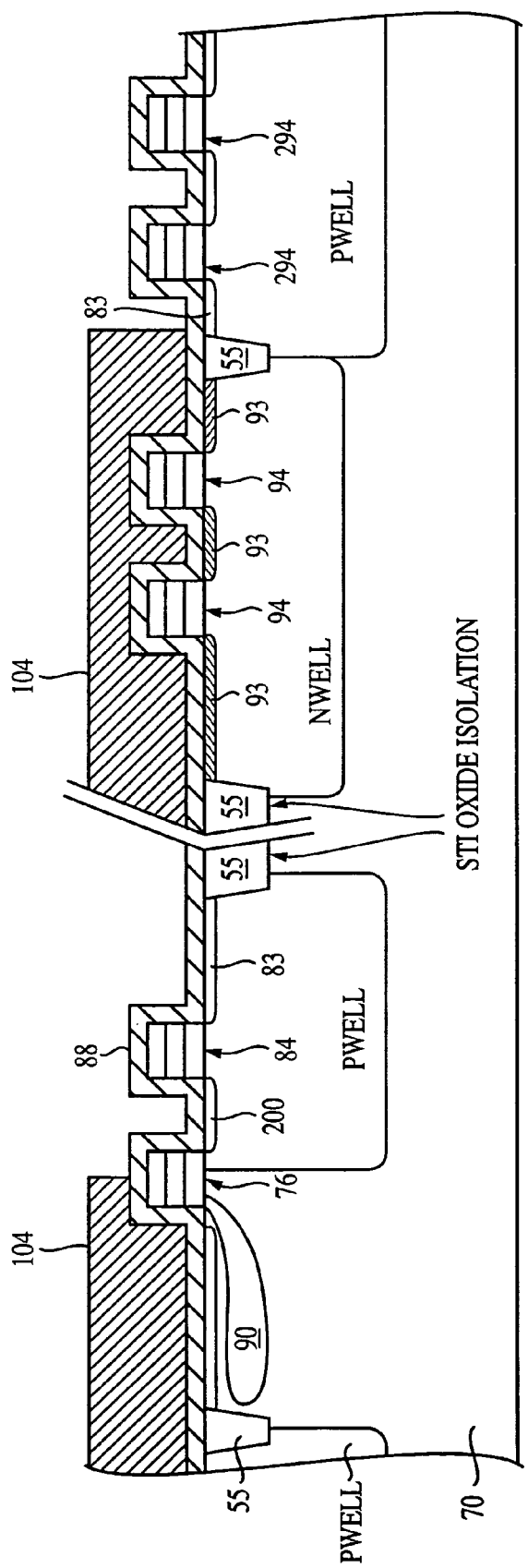

After gate patterning shown in FIG. 2, photoresist layer 74 is removed using an oxygen containing plasma process. After stripping photoresist 74 from over gates 76, 84, 94 and 294, doping operations such as P-Well implants, N-Well implants, transistor n- and p-implants, photodiode n-type implants, angled diode implants, and other angled implants may be performed with appropriate photoresist masks, which are also stripped. Trench isolation regions 55 may be formed by an STI process, a Local Oxidation of Silicon (LOCOS) process, or other suitable process. As shown in FIG. 3, transistor n-type implants, for example N-channel lightly doped drain (LDD) implant 83, may be formed in P-Well 85 in the array. Transistor p-type implants, for example P-channel pLDD implant 93, may be formed in N-Well 95 in the periphery. Then, a layer of spacer oxide 88 is deposited over gates 76 and 84 in the array, and over gates 94 and 294 in the periphery.

As shown in FIG. 3, spacer insulator 88 is deposited on substrate 70 as well as the sidewalls and upper surfaces of gates 76, 84 and 94. In particular, spacer insulator 88 is formed over the upper surface of photodiode 90. Spacer insulator 88 may be a layer of tetraethyl orthosilicate (TEOS) formed by conventional deposition processes, for example chemical vapor deposition (CVD). The spacer insulator deposition may be an oxide, a nitride, a metal oxide, or a combination of these materials. Spacer insulator layer 88 may also be formed with a conformality of approximately 50% to 100%, and with a thickness in the range of about 100 to 2000 Angstroms, preferably from about 200 to about 1000 Angstroms.

After spacer insulator 88 is formed, further doping can be performed, such as a surface P$^+$ implant of photodiode 90 with a photoresist mask that is then stripped.

FIG. 3 also shows a photoresist layer 104 deposited and patterned. The photodiode region 90 is covered with resist as are the p-channel transistors 94. The N-channel transistors in the array 76, 84 and the N-channel transistors in the periphery 294 have had the resist removed in these regions as a result of light exposure and resist development.

Figure 6:
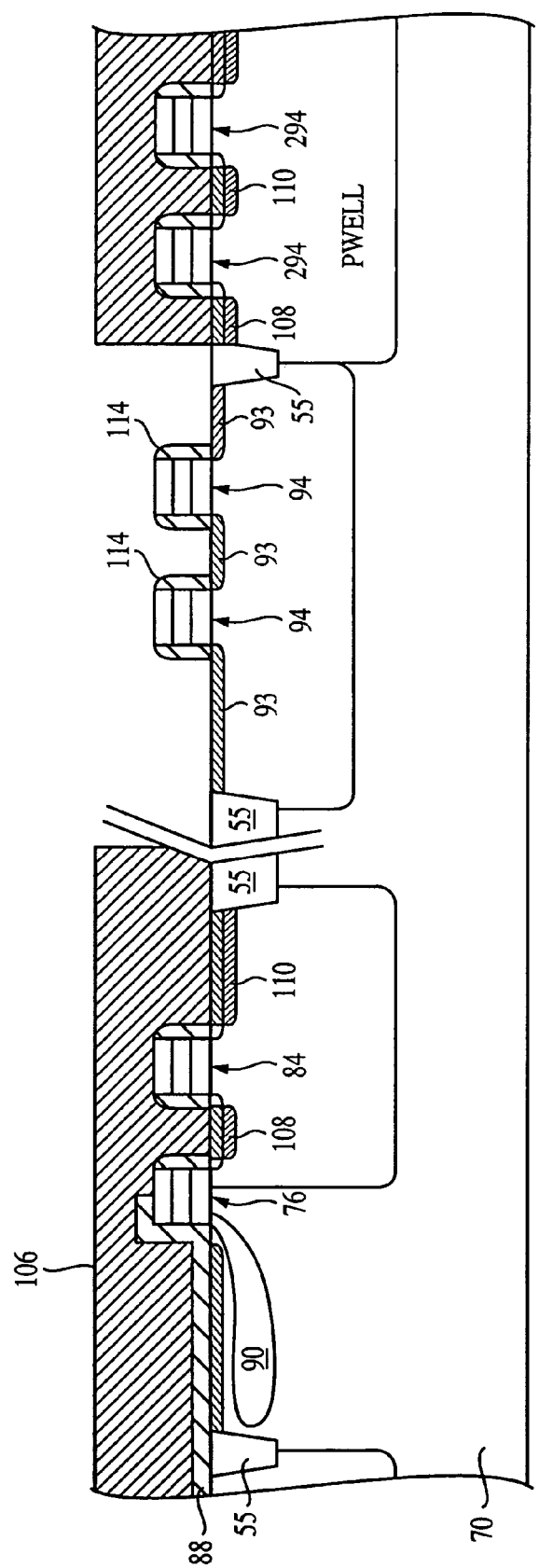
Figure 7:
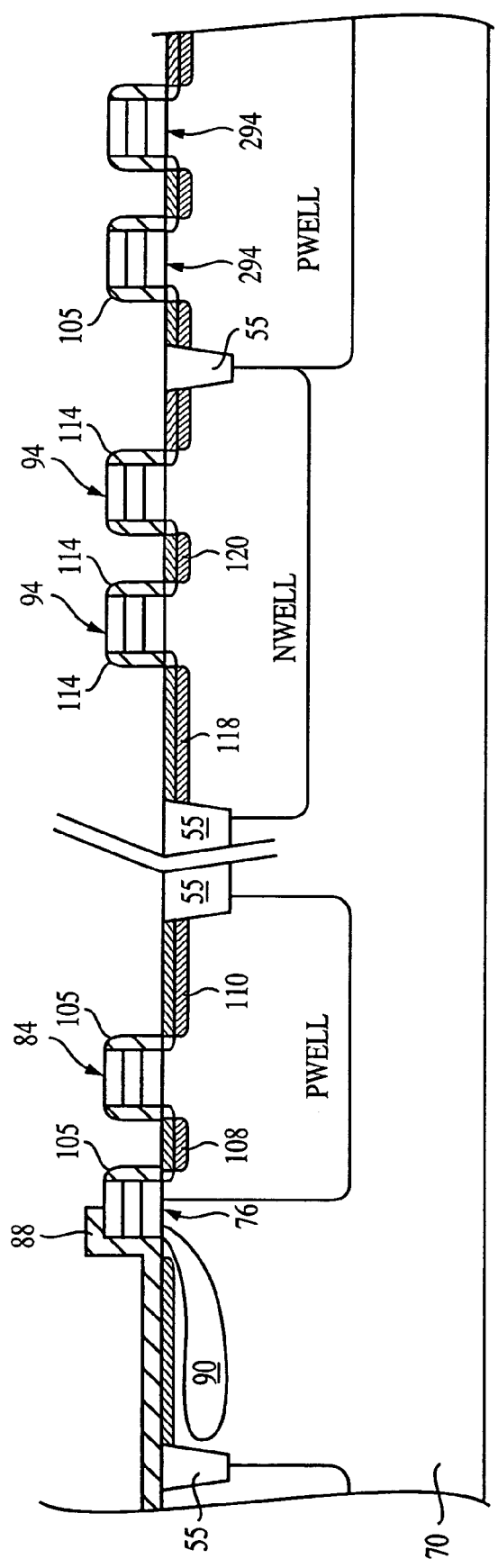
Figure 8:
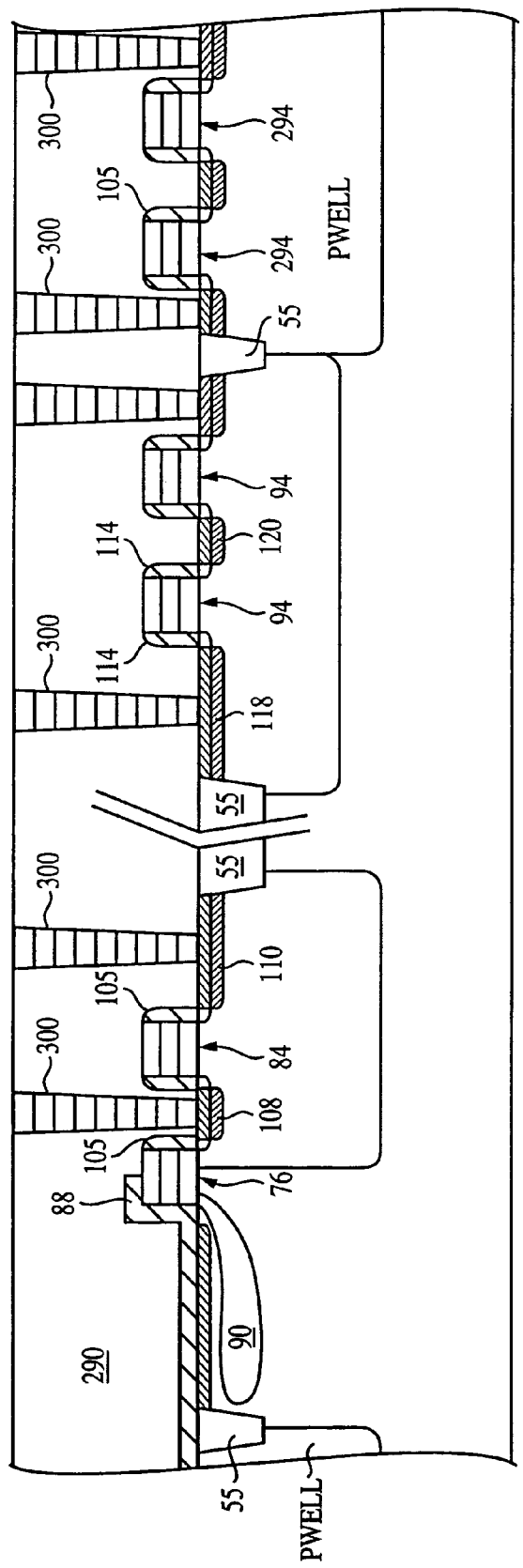
FIG. 8 is a schematic cross-sectional view showing a completed stage of production of an IC with patterned contacts and a dual masked spacer etch.

It is to be understood that the scope of this invention is not to be limited by the examples shown in FIGS. 3–7, as to which regions are masked. In FIG. 3, the photosensitive node 90 in portion 58 is shown protected by photoresist 104 but the floating diffusion region 200 is shown with the resist removed. It is also possible to either partially or entirely cover the floating diffusion region 200 with photoresist 104. If the contact 300 to the floating diffusion region 200 does not have an N$^+$ region below the contact 300, as shown in FIG. 8, then a Schottky contact is formed. The invention does not require a Schottky contact on the floating diffusion region 200.

In another embodiment, it is possible to protect any or all of the charge collecting nodes in the array, including the photosensor 90 and floating diffusion region 200, and open up either or both of the n-channel and p-channel regions in the periphery.

Figure 4:
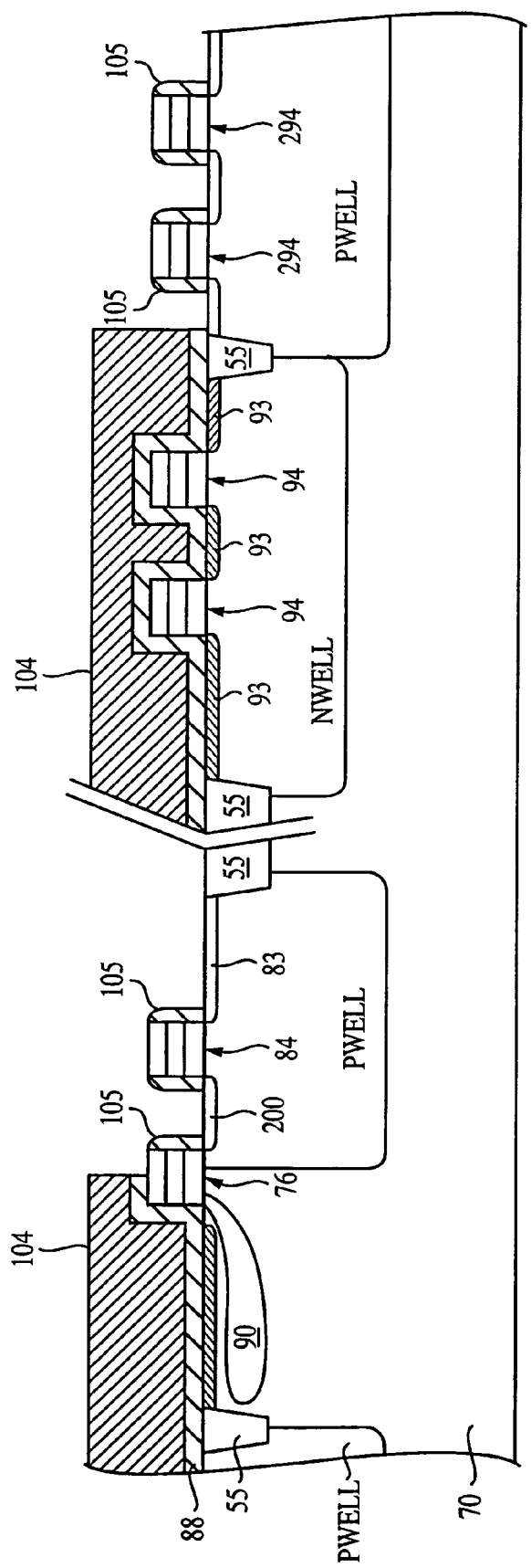

FIG. 4 illustrates a stage of processing subsequent to that shown in FIG. 3. At this stage, a first masked spacer etch is performed on exposed areas of spacer insulator 88 to form sidewall spacers 105. In this illustrated embodiment, etched sidewall spacers 105 are formed at an angle, such that the upper portion of spacers 105 are approximately aligned with the upper surfaces of gate structures 76, 84, and 294 but spacers 105 could have other shapes. Spacer formation is achieved by an anisotropic dry etch, which forms spacers 105 on sidewalls of gates 76, 84, and 294. During this first masked spacer etch, photodiode 90 is covered with a masking layer of the photoresist 104.

Figure 5:
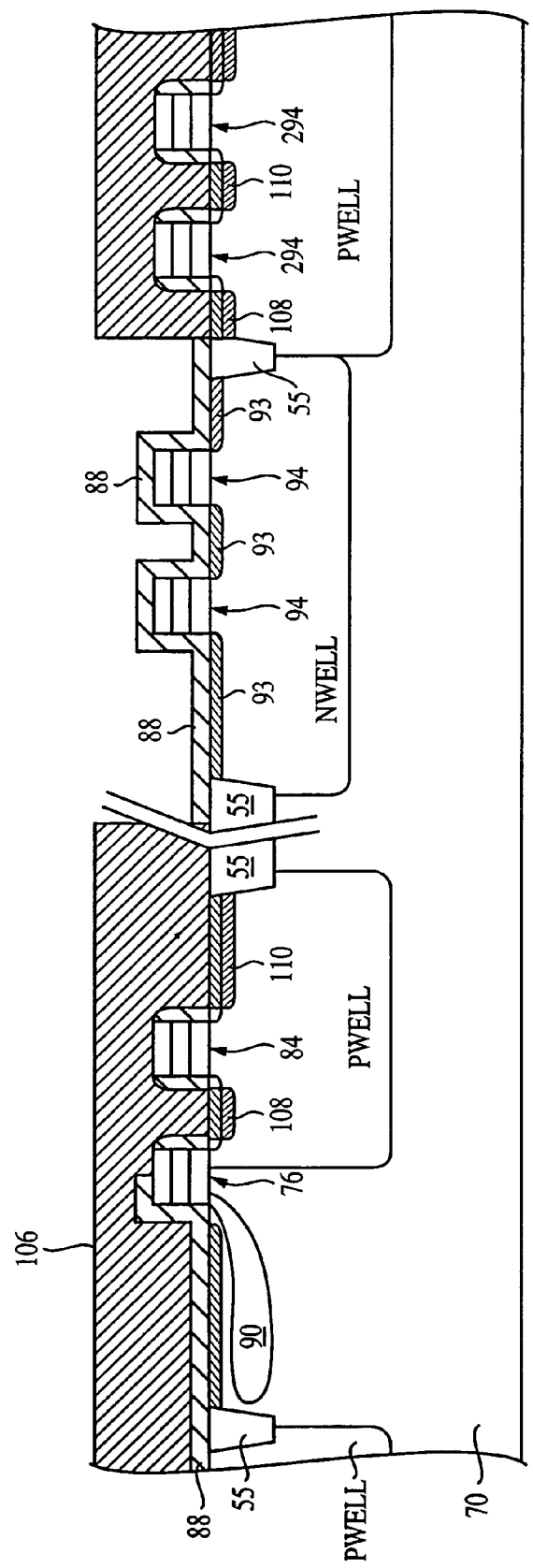

After formation of spacers 105, N$^+$ doping is performed by ion implantation. As shown in FIG. 5, heavily doped N$^+$ type source/drain regions 108 and 110 have been implanted into substrate 70. Source/drain regions 108 and 110 may be implanted by any suitable method, including ion implantation of phosphorus, arsenic, antimony or any other N type dopant, at varying doses, for example, in the range of about $5 \times 10^{14}$ to $5 \times 10^{16}$ atoms/cm$^2$ and an energy in the range of about 1 KeV to about 50 KeV. After ion implantation, photoresist 104 can be stripped.

Gates 76, 84 and 294 and their sidewall spacers provide an implant mask for the underlying portion of substrate 70. As a result, the boundaries of source/drain regions 108 and 110 may be substantially aligned with the lateral edges of sidewall spacers 105.

After the N+ type source/drain implants, a photoresist layer 106 is deposited and patterned, leaving a mask over the array of pixels, as shown in FIG. 5. The mask covers spacer oxide 88 formed over the entire photodiode 90, and also covers gates 76, 84 and 294. Photoresist 106 is exposed, developed and therefore removed, however, in the periphery where P-channel gates 94 are located.

FIG. 6 depicts a stage of processing subsequent to that shown in FIG. 5. At this stage, a second masked spacer etch is performed on the spacer insulator 88 in the P-channel periphery to form sidewall spacers 114. Spacer formation is achieved by an anisotropic dry etch, which form spacers 114 on both sidewalls of P-channel gates 94 in the periphery. During this second masked spacer etch, the photodiode 90 remains covered with photoresist 106.

After formation of spacers 114, P+ doping is performed. As illustrated in FIG. 7, heavily doped P+ type source/drain regions 118 and 120 are implanted into substrate 70. Source/drain regions 118 and 120 may be implanted with any suitable P-type dopant, for example boron, boron-difluoride, or indium, in any dose range, for example, in the range of about $5 \times 10^{14}$ to about $5 \times 10^{16}$ atoms/cm$^2$ and an energy in the range of about 1 to about 50 KeV.

Following the P type source/drain implants, photoresist layer 106 is removed from over the array. An elevated-temperature drive step may also be performed, after which the N-channel and P-channel devices are fully formed. The structure shown in FIG. 7 may also be covered with a number of translucent or transparent insulating and passivation layers (not shown) formed over the CMOS image device. Such insulating and passivation layers are typically SiO$_2$, BPSU, TEOS, BPSG, ILD, nitride, PSG, BSG, or SOG which can be planarized. Conventional processing steps may also be carried out to form, for example, contacts in the insulating layers to provide electrical connection with the implanted source/drain regions and other wiring to connect gate lines and other connections in the pixel. The contact holes may be metallized to provide electrical contact to a photogate, reset gate and transfer gate. Further layers may provide filters and lenses, such as with polymide. Other conventional processing steps may also be carried out to complete the formation of additional components. The order of the process steps may be varied as is required or convenient for a particular process flow.

The structure illustrated in the embodiment in FIG. 7 provides spacers on the gates in the array and the periphery, and a layer of spacer insulator 88 remains over photodiode 90.

It should be understood that the invention is applicable to providing photodiodes 90 in many arrangements and orientation, and with many shapes and geometry, to be integrated with other components of a semiconductor device. In accordance with one embodiment of the invention, each pixel of a CMOS image device comprises a pinned photodiode for performing photoelectric conversion. In the case of a photoconductor photosensor as an example of an overlying photosensor, it is understood that the sensitive area to be protected from the spacer etch is the corresponding region in the substrate where charge is collected. The CMOS image sensor may optionally include a photogate, photoconductor, or other image to charge converting device, in lieu of a photodiode, for initial accumulation of photo-generated charge.

The invention also applies to CCD imagers. The photosensitive node element in the CCD imager can have improved performance, including improved dark current performance, by employing masked spacer etches. Spacers are formed in the periphery and in the array where needed while the photosensitive storage node(s) are masked.

The steps in processing after FIG. 7 are shown in FIG. 8. In FIG. 8, an insulator 290, for example an undoped oxide, PSG, or BPSG, is deposited by CVD or spin-on techniques. The insulator may be planarized by resist etch-back or chemical mechanical planarization (CMP) techniques. Contact holes 300 are patterned and etched down to the diffusions and gates. For simplicity, only a few contacts are shown in FIG. 8 formed down to a few select diffusion regions. The contacts 300 are filled with metal such as Ti/Al—Si—Cu or Ti/TiN/W, for example. The metal in the contacts 300 may be removed from the top of the insulator using CMP techniques, for example, or metal lines may then be patterned and etched. An exemplary contact 300 formed down to floating diffusion node 200 is shown. The final steps in completing the processing including forming metal lines, vias, passivation, and bond pad openings are well known.

Figure 9:
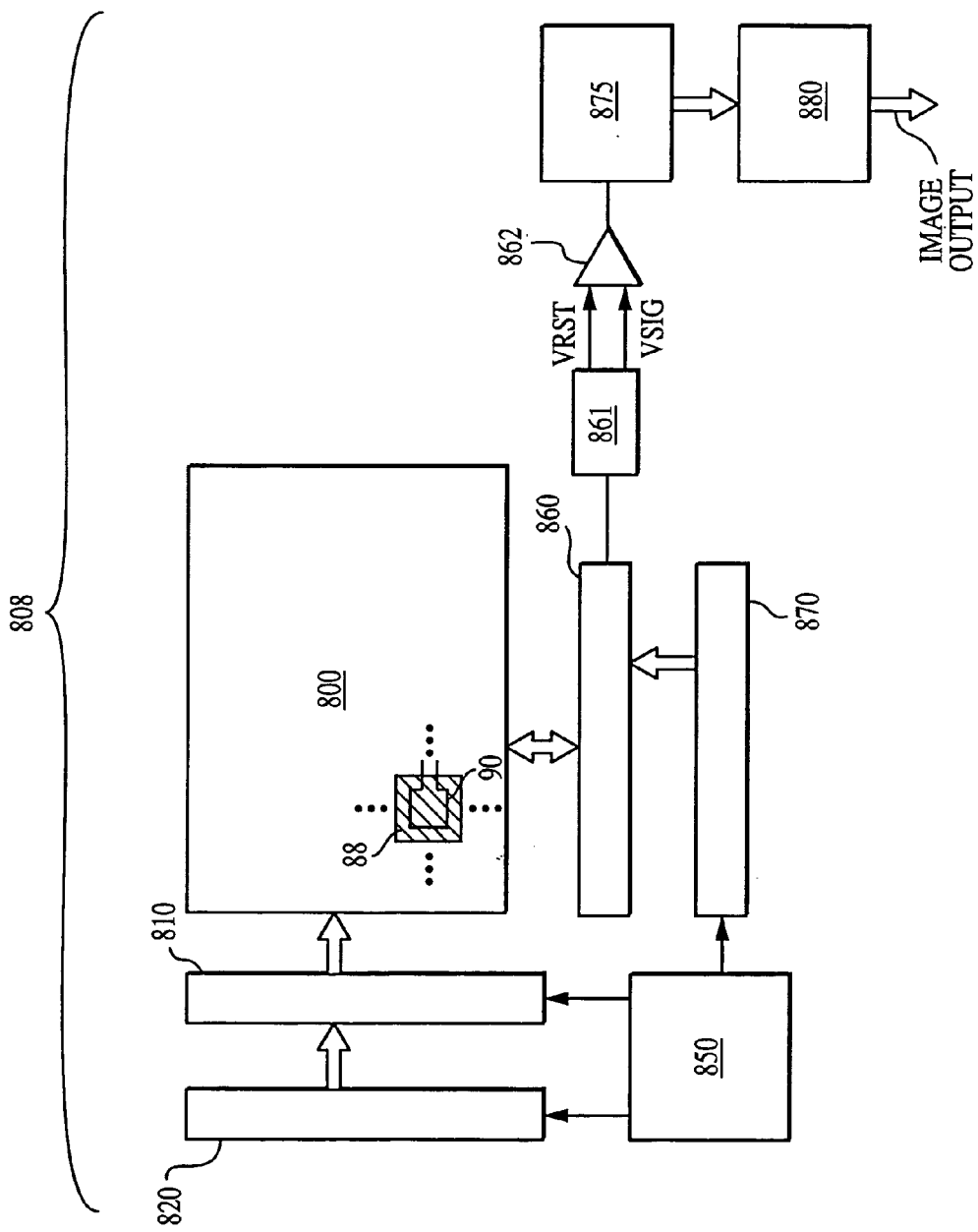
FIG. 9 illustrates a block diagram of a CMOS imager device having a pixel array, wherein the imager device may be combined with a processor in a single integrated circuit fabricated according to the present invention.

FIG. 9 illustrates a block diagram of a CMOS imager device 808 having a pixel array 800 containing a plurality of pixels arranged in rows and columns. The pixels of each row in array 800 are all turned on at the same time by a row select line, and the pixels of each column are selectively output by respective column select lines. The row lines are selectively activated by a row driver 810 in response to row address decoder 820. The column select lines are selectively activated by a column selector 860 in response to column address decoder 870. The pixel array is operated by the timing and control circuit 850, which controls address decoders 820, 870 for selecting the appropriate row and column lines for pixel signal readout. The pixel column signals, which typically include a pixel reset signal ($V_{rst}$) and a pixel image signal ($V_{sig}$), are read by a sample and hold circuit 861 associated with the column selector 860. A differential signal ($V_{rst}-V_{sig}$) is produced by differential amplifier 862 for each pixel which is amplified and digitized by analog to digital converter 875 (ADC). The analog to digital converter 875 supplies the digitized pixel signals to an image processor 880.

Imager device 808 is illustratively an integrated circuit. Pixel array 800 includes portions of spacer material 88 over photosensors 90, as shown for one pixel, and the gates of N-channel transistors in pixel array 800 have spacers that also include spacer material 88. Meanwhile, peripheral components including timing and control circuit 850, decoders 820 and 870, drivers 810 and 860, sample and hold circuit 861, amplifier 862, ADC 875, and processor 880 include N-channel and P-channel devices whose gates also have spacers that include spacer material 88.

While the above description relates to methods for forming CMOS imager devices using a dual masked spacer etch to achieve improved dark current performance by leaving spacer material over charge collection nodes including but not limited to the photosensor and the floating diffusion node, and devices with spacer material over charge collection nodes including but not limited to the photosensors and the floating diffusion node, one skilled in the art will recognize that the invention can be used to form other types of imager devices for integration with one or more processing components in a semiconductor device. For example, various types of CMOS imager circuitry with different numbers of transistors connected in various configurations could be used. Certain CMOS imagers include a storage node which may be advantageously protected as per the invention. Also, the invention is not limited to CMOS imagers, and might be used in any suitable image sensor, for example, CCD image sensors or imagers that include features of both CMOS and CCD imagers. The last (output) stage of a CCD image sensor, for example, can provide sequential pixel signals as output signals using a floating diffusion node, source follower transistor, and reset gate in a similar manner to the way these elements are used in the pixel of a CMOS imager. The CCD imager also contains photosensor regions such as a photodiode, photogate, or photoconductor. The storage nodes associated with these photosensors may be advantageously protected using methods described herein for the invention. Accordingly, the techniques described above may be employed in CCD image sensors as well as CMOS image sensors. The imager devices as described above may also be formed as different size megapixel imagers, for example imagers having arrays in the range of about 0.1 megapixels to about 20 megapixels.

It should again be noted that although the invention has been described with specific reference to producing imagers using a dual masked spacer etch, the invention has broader applicability. For example, the dual masked spacer etch process described above is but one method of many that may be used, including single masked spacer etches in which spacer material remains over sensitive array charge collection or storage nodes while spacers for gates of both periphery N-channel and periphery P-channel and selectively chosen array N-channel devices are etched. The above description and drawings illustrate embodiments that achieve objects, features and advantages of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. An imaging array comprising:
   at least one pixel comprising:
      a photosensitive region;
      a gate structure;
      a continuous layer of an insulating material formed over the photosensitive region;
      a spacer of the insulating material formed on at least one side of the gate structure; and
      a layer of insulating material formed over said continuous layer of insulating material, said gate structure and said spacer.

2. The imaging array of claim 1, wherein the pixel is part of a CMOS imager.

3. The imaging array of claim 1, wherein said gate structure is a transfer gate.

4. The imaging array of claim 1, wherein said gate structure is a reset gate.

5. The imaging array of claim 1, wherein said gate structure is a source follower gate.

6. An integrated circuit with an imaging array comprising:
   at least one pixel comprising:
      a photosensitive region;
      a gate structure;
      a continuous layer of an insulating material formed over the photosensitive region;
      a spacer of the insulating material formed on at least one side of the gate structure;
      a peripheral circuit, said peripheral circuit having at least one transistor with a second gate structure and a second spacer of the insulating material formed on at least one side of the second gate structure; and
      a layer of insulating material formed over said continuous layer of insulating material, said gate structure, said spacer and said peripheral circuit.

7. The integrated circuit of claim 6, wherein the pixel is part of a CMOS imager.

8. The integrated circuit of claim 6, wherein said gate structure is a source follower gate.

9. The integrated circuit of claim 6, wherein said gate structure is a reset gate.

10. The integrated circuit of claim 6, wherein said gate structure is a transfer gate.

11. The integrated circuit of claim 6, wherein said gate structure is a row select gate.

12. The integrated circuit of claim 6, wherein said second gate structure is a source follower gate.

13. The integrated circuit of claim 6, wherein said second gate structure is a reset gate.

14. The integrated circuit of claim 6, wherein said second gate structure is a transfer gate.

15. The integrated circuit of claim 6, wherein said second gate structure is a row select gate.

16. An imager system, comprising:
   a processor; and
   an integrated circuit connected to provide signals to said processor, said integrated circuit comprising:
      a pixel array which comprises a plurality of pixels, at least one said pixel of said pixel array comprising:
         a photosensitive region;
         at least one gate structure;
         a layer of an insulating material over the photosensitive region; and
         a spacer of the insulating material formed on at least one side of at least one gate structure; and
         a peripheral circuit, said peripheral circuit having at least one transistor with a second gate structure having a second spacer of the insulating material formed on at least one side of the second gate structure.

17. An imaging array comprising:
   at least one pixel comprising:
      a photosensitive region;
      a gate structure for a row select gate;
      a layer of an insulating material formed over the photosensitive region; and
      a spacer of the insulating material formed on at least one side of the gate structure.

18. An integrated circuit with an imaging array comprising:
   at least one pixel comprising:
      a photosensitive region;
      a gate structure for a row select gate;
      a layer of an insulating material formed over the photosensitive region; and
      a spacer of the insulating material formed on at least one side of the gate structure; and
      a peripheral circuit, said peripheral circuit having at least one transistor with a second gate structure and a spacer of the insulating material formed on at least one side of the second gate structure.

19. An integrated circuit with an imaging array comprising:
   at least one pixel comprising:
      a photosensitive region;
      a gate structure;

a layer of an insulating material formed over the photosensitive region; and a spacer of the insulating material formed on at least one side of the gate structure; and a peripheral circuit, said peripheral circuit having at least one transistor with a second gate structure for a row select gate and a spacer of the insulating material formed on at least one side of the second gate structure.

* * * * *